(12) United States Patent
Hirota

(10) Patent No.: US 6,228,702 B1
(45) Date of Patent: May 8, 2001

(54) METHOD OF MANUFACTURING SEMICONDUCTOR DEVICE

(75) Inventor: Toshiyuki Hirota, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/450,460

(22) Filed: Nov. 29, 1999

(30) Foreign Application Priority Data

Nov. 30, 1998 (JP) .................................................. 10-340684

(51) Int. Cl.$^7$ ................................................ H01L 21/8242
(52) U.S. Cl. ........................ 438/240; 438/369; 438/430; 438/287; 438/780; 438/785
(58) Field of Search ..................... 438/240, 369, 438/287, 391, 388, 430, 435, 437, 780, 781, 785

(56) References Cited

U.S. PATENT DOCUMENTS

| | | | |
|---|---|---|---|
| 5,142,438 | * 8/1992 | Reinberg et al. | 361/313 |
| 5,336,638 | 8/1994 | Suzuki et al. | 437/190 |
| 5,688,724 | * 11/1997 | Yoon et al. | 437/235 |
| 5,763,300 | * 6/1998 | Park et al. | 438/240 |
| 5,786,248 | * 7/1998 | Schuegraf | 438/240 |
| 5,837,593 | * 11/1998 | Park et al. | 438/396 |
| 6,037,235 | * 3/2000 | Narwankar et al. | 438/396 |

FOREIGN PATENT DOCUMENTS

| | | |
|---|---|---|
| 0 474 140 A1 | 8/1991 | (EP) . |
| 2 257 829 | 6/1992 | (GB) . |
| 5-243524 | 9/1993 | (JP) .............................. H01L/27/108 |
| 407221201 | * 8/1995 | (JP) . |
| 7-221201 | 8/1995 | (JP) .............................. H01L/21/822 |

OTHER PUBLICATIONS

Shinriki H., and Nakata M. "UV–03 and Dry–02: Two–Step Annealed Chemical Vapor–Deposited Ta2O5 Films for Storage Dielectrics of 64–Mb DRAM's" IEEE, vol. 38, No. 3, pp. 455–462, Mar. 1991.*

* cited by examiner

Primary Examiner—Matthew Smith
Assistant Examiner—Renzo N. Rocchegiani
(74) Attorney, Agent, or Firm—Hayes, Soloway, Hennessey, Grossman & Hage, P.C.

(57) ABSTRACT

In a semiconductor device fabricated according to a method of the present invention, a microelectronic capacitor is provided with a double-layered tantalum oxide film serving as a capacitance insulation film. The double-layered tantalum oxide film is constructed of: a first tantalum oxide film formed at a temperature of about 510° C. under a high pressure of about 3.0 Torr in an atmosphere containing oxygen in a first film forming step; and, a second tantalum oxide film formed on the first tantalum oxide film at a temperature of about 510° C. under a low pressure of about 0.3 Torr in an atmosphere free from oxygen in a second film forming step.

15 Claims, 11 Drawing Sheets aspect ratio = B/A
coverage = b/a

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device provided with a microelectronic storage capacitor for storing a charge to represent information or data therein, in which capacitor a tantalum oxide (i.e., $Ta_2O_5$) film is used as a capacitance insulation film.

2. Description of the Related Art

In general, LSI (i.e., Large Scale Integration) circuits, which typify semiconductor devices, are classified into two categories, i.e., memory products and logic products. In recent years, particularly, the former (i.e., memory products) have been making a remarkable progress along with recent developments in semiconductor fabrication techniques. Further, the memory products are classified into two subcategories, i.e., DRAMs (i.e., Dynamic Random Access Memories) and SRAMs (i.e., Static Random Access Memories). Most of these memory products are constructed of the MOS (i.e., Metal Oxide Semiconductor) transistors excellent in integration density. In comparison with the SRAMs, since the DRAMs are capable of more effectively using their advantages in integration density, it is possible for the DRAMs to realize the cost reduction in manufacturing, which enhances their application to various memory units in information instruments and like equipment or systems.

In operation, since the DRAMs store charges representing data or information in their microelectronic capacitors, the individual microelectronic capacitors formed in the semiconductor substrates of the DRAMs are restricted in their occupation areas as the volume of information being stored in the DRAMs increases. Consequently, a need exists in the art for an improved technique that increases the microelectronic capacitors of the DRAMs in capacitance (i.e., electrostatic capacity). When these capacitors of the DRAMs are not sufficient in capacitance for storing charges representing the data or information, the DRAMs often fail to function properly under the influence of external noise signals and the like, which causes various types of errors, for example, typified by errors in operation various software programs and the like.

Heretofore, a silicon oxynitride (i.e., SiON) film, which is reduced in film thickness and serves as a capacitance insulation film of the microelectronic capacitor, has been obtained by nitrifying a silicon oxide (i.e., $SiO_2$) film. However, in such a silicon oxynitride film thus obtained, its minimum allowable film thickness when expressed in oxide-film converted film thickness (i.e., equivalent oxide thickness) Teff is within a range of from 45 to 50 Angstroms, which is a critical point of occurrence of a tunnel current of the transistor, wherein: Teff is a capacitance per unit area of the thus formed capacitor. In order to increase the capacitor in capacitance, heretofore, various types of three-dimensional configurations of electrodes, for example such as those of box types, cylinder types, fin types, HSG (i.e., Hemispherical Grain) types, and of like types have been proposed to increase the capacitor's electrode in surface area. Although much more complicated configurations have been proposed with respect to the capacitor's electrode in the art of today, since there is a severe restriction in space in the transistor, it is hard to increase the capacitor in capacitance by increasing the surface area of the capacitor's electrode. Due to the existence of the above difficulty, widely used in the art of today in order to increase the capacitor in capacitance is a technique that utilizes a high-dielectric-constant material in the capacitance insulation film of the capacitor.

In the art of today, there are known various types of the high-dielectric-constant materials. However, in case that these materials are employed in the capacitance insulation films of the capacitors, it is necessary to previously check them in terms of: easiness in forming them into a film; and, compatibility with a pair of the electrodes disposed adjacent to opposite surfaces of the capacitance insulation film made of these materials. Consequently, a dielectric material, even when it is sufficiently high in dielectric constant, is not necessarily employed as a material for the capacitance insulation film of the capacitor. Under such circumstances, widely used in the art as a material for the capacitance insulation film of the capacitor is tantalum oxide. The dielectric constant (a value of which is within a range of from 40 to 47) of a film made of tantalum oxide (hereinafter referred to as the tantalum oxide film) is ten times higher than the dielectric constant of a silicon oxide film having been heretofore used as the capacitance insulation film in the art, and is six times higher than the dielectric constant of a silicon nitride film (i.e., $Si_3N_4$). Further, the tantalum oxide film is easier in formation. Consequently, it is possible to increase the capacitor in capacitance by using the tantalum oxide film as the capacitance insulation film in the capacitor.

FIGS. 14A to 14C show a conventional method for manufacturing a semiconductor device. Now, with reference to these drawings, the conventional method for manufacturing the semiconductor device will be described according to its process step.

First, as shown in FIG. 14A, for example, according to conventional known techniques, a P-type semiconductor substrate 51 is prepared. Then, formed in a surface of this semiconductor substrate 51 are: an N-type source region 52 and an N-type drain region 53 which is spaced apart from the source region 52; a gate insulation film 54 formed on the surface of the substrate 51 between the source region 52 and the drain region 53; and, a gate electrode 55 formed on the gate insulation film 54, so that an N-type MOS transistor 56 is formed on the semiconductor substrate 51. The thus formed N-type MOS transistor 56 is combined with a microelectronic capacitor 64 (shown in FIG. 14C) to form a single memory cell of the semiconductor device. In FIG. 14A: the reference numeral 57 denotes an interlayer insulation film which covers the entire upper surface of the semiconductor device; and, the reference numeral 58 denotes an element isolating insulation film for isolating the individual regions of the semiconductor device from each other.

Next, as shown in FIG. 14B, a minute contact hole 59 is formed in the interlayer insulation film 57 in a position corresponding to the N-type drain region 53 (or the N-type source region 52) of the N-type MOS transistor 56. After that, a conductive film is formed to cover the entire upper surface of the semiconductor device including the entire inner surface of the contact hole 59 so as to be electrically connected with the N-type drain region 53 (or the N-type source region 52). Then, the thus formed conductive film is patterned and formed into a lower electrode (i.e., storage electrode) 61 of the capacitor 64, as shown in FIG. 14B.

After completion of formation of the lower electrode 61 of the capacitor 64 (shown in FIG. 14C), a tantalum oxide film 62 is formed to have an appropriate film thickness by a CVD (i.e. Chemical Vapor Deposition) process to serve as a capacitance insulation film of the capacitor 64, as shown in FIG. 14C. In the CVD process, the semiconductor substrate 51 is received in a reactor container of a CVD apparatus. After that, in a condition in which the interior of the reactor container is kept at a predetermined steady film forming pressure, a mixture gas containing: pentaethoxy tantalum, i.e., one of tantalum alkoxides; and, oxygen is fed to the reactor container so that film forming processes are performed inside the reactor container, whereby the tantalum oxide film 62 having a desired film thickness is formed inside the reactor container. After that, an upper electrode (i.e., plate electrode) 63 is formed on the thus formed tantalum oxide film 62, which makes it possible for the tantalum oxide film 62 to serve as the capacitance insulation film of the capacitor 64. As shown in FIG. 14C, disposed adjacent to an upper and a lower surface of the tantalum oxide film 62 are the upper electrode 63 and the lower electrode 61, respectively, whereby the capacitor 64 is formed. As is described in the above, the capacitor 64 is electrically connected in series with the N-type MOS transistor 56 to form the memory cell of the semiconductor device.

On the other hand, as described above with reference to FIG. 14C, when the tantalum oxide film 62 is formed with the use of the organic source gas, the tantalum oxide film 62 thus formed contains a few percent of carbon. Consequently, when various types of heat treatments are performed later in a process for manufacturing the LSIs, carbon contained in the tantalum oxide film 62 combines with oxygen of the tantalum oxide film 62 to become CO or $CO_2$ gas which escapes from the tantalum oxide film 62. Due to such escape of CO or $CO_2$ gas from the tantalum oxide film 62, a concentration of oxygen in the tantalum oxide film 62 reduces, which facilitates current leakage through the tantalum oxide film 62 serving as the capacitance insulation film of the capacitor 64.

In order to prevent such current leakage from occurring in the tantalum oxide film 62 due to the lack of oxygen contained in the tantalum oxide film 62, for example, in a conventional method for manufacturing a semiconductor device disclosed in Japanese Patent Laid-Open No. Hei 9-121035, a microelectronic capacitor of the semiconductor device is fabricated in a manner such that: a tantalum oxide film is formed on a lower electrode of the semiconductor substrate in a first film forming step; in a second film forming step subsequent to the first film forming step, an ultraviolet ray-ozone annealing process (hereinafter referred to as the UV-$O_3$ annealing process) is performed with respect to the semiconductor device provided with the tantalum oxide film thus formed therein; and, in a third film forming step subsequent to the second film forming step, the first and the second film forming step are repeatedly performed.

Although the conventional method disclosed in the Japanese Patent Laid-Open No. Hei 9-121035 is capable of preventing occurrence of the current leakage caused by the lack of oxygen contained in the tantalum oxide film serving as the capacitance insulation film of the capacitor, such conventional method suffers from deterioration in physical properties (i.e., film quality) of the tantalum oxide film.

In other words, according to experiments conducted by the inventor of the present invention, it has been found that: the conventional method produces a low-dielectric-constant film in the boundary of the lower electrode; and, it is very hard to modify or improve the thus formed low-dielectric-constant film in physical properties (i.e., film quality). Further, due to the existence of such low-dielectric-constant film, the tantalum oxide film of the semiconductor device fabricated by the conventional method is poor in TDDB (i.e., Time Dependent Dielectric Breakdown) characteristics. Consequently, also in this respect, the tantalum oxide film is poor in physical properties.

Further, in order to increase the capacitor of the semiconductor device in capacitance, it is necessary to reduce the film thickness of the tantalum oxide film to the smallest possible value for preventing occurrence of the current leakage in the tantalum oxide film. In order to meet such need, it is necessary to improve the tantalum oxide film (i.e., capacitance insulation film) both in film quality and in coverage. In other words, since the tantalum oxide film serving as the capacitance insulation film of the capacitor in the semiconductor device is formed on a so-called HSG (i.e., Hemispherical Grain) conductive silicon film which has been formed on the lower electrode and increased in its surface area with its rough surface, its coverage problem becomes critical.

SUMMARY OF THE INVENTION

In view of the above, it is an object of the present invention to provide a method of manufacturing a semiconductor device provided with a capacitance insulation film which is small in film thickness, excellent in film quality and in reliability, and made of tantalum oxide.

Further, it is another object of the present invention to provide a method of manufacturing a semiconductor device provided with a capacitance insulation film, wherein the capacitance insulation film is sufficiently small in film thickness, has its film quality be compatible with excellent coverage properties, and made of tantalum oxide.

According to a first aspect of the present invention, there is provided a method of manufacturing a semiconductor device in which a tantalum oxide film is formed on a semiconductor substrate by a chemical vapor deposition process with the use of a source gas containing a metal alkoxide, comprising:

a first film forming step for forming a first one of the tantalum oxide film under a first film forming pressure; and a second film forming step for forming a second one of the tantalum oxide film on the first one under a second film forming pressure which is lower than the first film forming pressure, wherein said second one is combined with said first one of said tantalum oxide film to form a double-layered tantalum oxide film.

In the foregoing, a preferable mode is one where in pentaethoxy tantalum is used as the metal alkoxide.

Also, a preferable mode is one wherein the first film forming step is performed with the use of the source gas containing oxygen.

Also, a preferable mode is one wherein the first one and/or the second one of the tantalum oxide film are/is used as a capacitance insulation film.

Further, a preferable mode is one wherein the first film forming pressure is within a range of from 1 to 10 Torr (133 Pa=1 Torr); and, the second film forming pressure is within a range of from 0.1 to 0.5 Torr.

Furthermore, a preferable mode is one wherein, in the first film forming step, the first one of the tantalum oxide film is formed to have a film thickness of from 10 to 30 Angstroms; and, in the second film forming step, the second one of the tantalum oxide film is formed on the first one to have a film thickness of from 30 to 80 Angstroms.

Still furthermore, a preferable mode is one wherein, after completion of formation of the first one and the second one, or the single one of the tantalum oxide film, an ultraviolet ray-ozone annealing process is performed; and, then, an oxygen annealing process is performed.

According to a second aspect of the present invention, there is provided a method of manufacturing a semiconductor device in which a single-layered tantalum oxide film is formed as a capacitance insulation film on a semiconductor substrate by a chemical vapor deposition process with the use of a source gas containing pentaethoxy tantalum, comprising:

a step for forming the single-layered tantalum oxide film at a temperature of from 500 to 560° C. under a pressure of from 1 to 10 Torr.

In the foregoing second aspect, a preferable mode is one wherein the single-layered tantalum oxide film is formed with the use of the source gas free from oxygen.

Also, a preferable mode is one wherein the single-layered tantalum oxide film is formed to cover a lower electrode of a capacitor which is formed on the semiconductor substrate.

Also, a preferable mode is one wherein the single-layered tantalum oxide film is formed to cover a conductive film, the conductive film being formed on the lower electrode to have its surface area increased.

Also, a preferable mode is one wherein a silicon film is used as the conductive film.

Also, a preferable mode is one wherein formed between the silicon film and the single-layered tantalum oxide film is a reaction prevention film for preventing the silicon film from reacting with the single-layered tantalum oxide film.

Further, a preferable mode is one wherein a silicon nitride film is used as the reaction prevention film.

Furthermore, a preferable mode is one wherein, after completion of formation of the first one and the second one, or the single one of the tantalum oxide film, an ultraviolet ray-ozone annealing process is performed; and, then, an oxygen annealing process is performed.

With the above configuration, the first tantalum oxide film is formed as the first capacitance insulation film in the first film forming step under the first film forming pressure, which step is followed by the second film forming step in which the second tantalum oxide film is formed continuously on the first tantalum oxide film as the second capacitance insulation film under the second film forming pressure lower than the first film forming pressure, so that the first and the second tantalum oxide film are stacked into a pile forming the double-layered tantalum oxide film in the semiconductor device of the present invention. Consequently, it is possible for the double-layered tantalum oxide film of the semiconductor device fabricated according to the method of the present invention to enjoy both the advantage obtained by the first film forming pressure and that obtained by the second film forming pressure.

In other words, it is possible for the double-layered tantalum oxide film in the semiconductor device of the present invention to have its sufficient film coverage compatible with the considerable improvement in its film quality, whereby the semiconductor device of the present invention to have its double-layered tantalum oxide film be considerably thin in its total film thickness and excellent in reliability.

Further, since the double-layered tantalum oxide film has its forming conditions to limit to a relatively narrow range with respect to each of the film forming pressures and the film forming temperatures in order to form the double-layered tantalum oxide film through a substantially continuous process, it is possible for the method of the present invention to form the double-layered tantalum oxide film excellent in reliability without increasing the number of process steps.

Consequently, it is possible for the method of the present invention to have the double-layered tantalum oxide film serving as the capacitance insulation film improved in film quality and reduced in total film thickness at the same time.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Figure 1A:
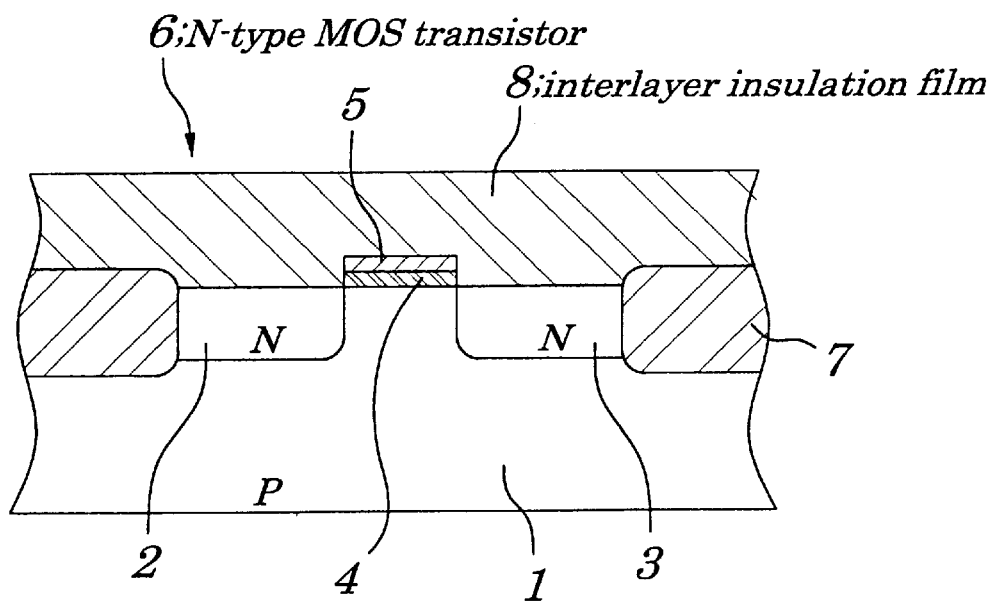
FIGS. 1A and 1B are cross sectional views of a semiconductor device, illustrating a first embodiment of a method of the present invention for manufacturing the semiconductor device, wherein a minute contact hole is formed and then filled with a plug conductive film.

The best modes for carrying out the present invention will be described in detail using embodiments of the present invention with reference to the accompanying drawings.

The present invention may, however, be embodied in various different forms and should not be construed as limited to the embodiments set forth herein; rather, these embodiments are provided so that this disclosure will be thorough and complete, and will fully convey the scope of the present invention to those skilled in the art.

In the accompanying drawings, the thickness of films and regions are exaggerated for clarity. Like reference numerals refer to like parts throughout the drawings.

Incidentally, it will also be understood that when a layer or film is referred to as being "on" another film or substrate, it can be directly on such another film or substrate, or intervening films may also be present therebetween.

Principles of the Invention

The results of the inventor's experiments have prepared the way for the present invention, and, therefore will be described here at first.

The inventor of the present invention has performed various types of experiments, and obtained a finding. In this finding, it is recognized that: in case that a tantalum oxide film is formed, it is possible to modify a low-dielectric-constant film formed in the boundary of a lower electrode of the tantalum oxide film in physical properties by limiting each of film forming pressures and film forming temperatures to an appropriate range, and therefore to improve the tantalum oxide film in quality.

Further, in case the tantalum oxide film is formed, the inventor of the present invention has found that: when the film is formed at a high pressure, the film thus formed is improved in physical properties but makes its coverage insufficient; and, in contrast with this, when the film is formed at a low pressure, the film thus formed is improved in film coverage but makes its physical properties poor. On the basis of this finding, it is recognized that it is possible for a microelectronic capacitor of the semiconductor device to improve its capacitance insulation film in physical properties and in film coverage by using a double-layered tantalum oxide film as the capacitance insulation film, wherein the double-layered tantalum oxide film is constructed of: a first tantalum oxide film formed at a high pressure in a first film forming step; and, a second tantalum oxide film formed at a low film forming pressure lower than the high film forming pressure in a second film forming step.

Experiment Results 1

Figure 5:
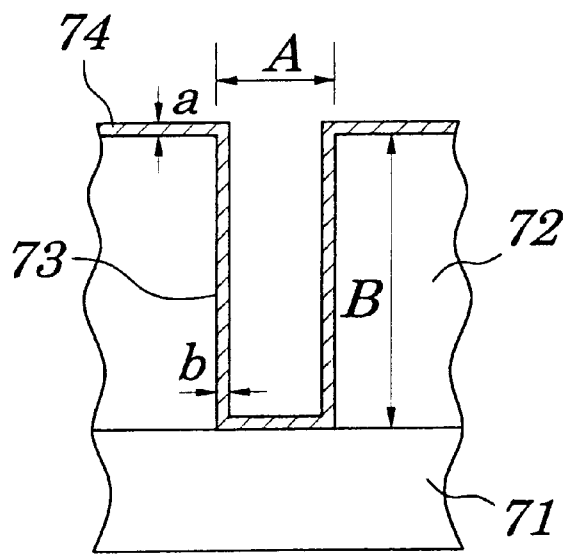
FIG. 5 is an enlarged cross sectional view of an essential part of the semiconductor device according to the present invention, illustrating an aspect ratio (i.e., B/A) used to describe the principles of the present invention.
Figure 7:
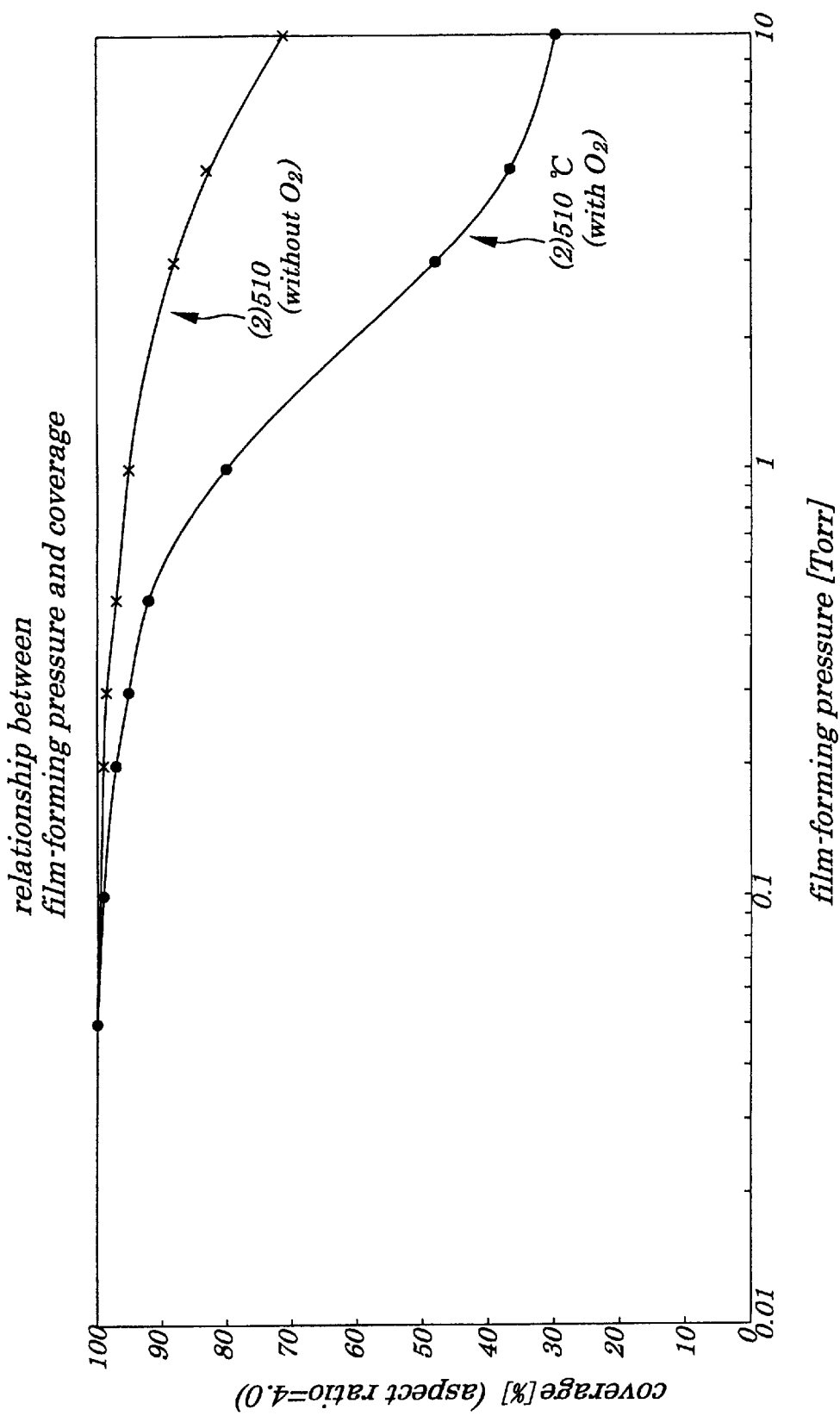
FIG. 7 is a diagram showing how the coverage varies as the film forming pressure goes from 0.01 to 10 Torr, which is used to describe the principles of the present invention.

The tantalum oxide film was formed. Through such formation of the tantalum oxide film, it was confirmed that the film coverage was dependent upon the film forming pressure. FIG. 7 is a diagram showing how the film coverage of a tantalum oxide film varies as the film forming pressure goes from 0.01 to 10 Torr, which is used to describe the principles of the present invention. In the diagram of FIG. 7: the vertical axis represents the coverage [%] (aspect ratio= 4.0); and, the horizontal axis represents the film forming pressure (Torr). Here, as shown in FIG. 5, a sample is prepared, wherein a minute contact hole 73 having an aspect ratio (B/A) of, for example, 4.0 is previously formed in a semiconductor substrate 71. This sample is received in a reactor container of the CVD (i.e., Chemical Vapor Deposition) apparatus, so that a tantalum oxide film 74 is formed to cover the sample in a manner such that: a first portion of the tantalum oxide film covering a top surface of the sample has a film thickness of "a"; and, a second portion of the tantalum oxide film covering an inner peripheral surface of the contact hole 73 has a film thickness of "b", as shown in FIG. 5, wherein a ratio of the film thickness "b" to the film thickness "a" (i.e., b/a) is defined as the above-mentioned coverage of the tantalum oxide film.

Fed to the above reactor container having its interior space kept at a temperature of approximately 510° C. was a first source gas comprising: PETa (i.e., pentaethoxy tantalum: $Ta(OC_2H_5)_5$)) gas having a flow rate of approximately 100 mg/min; oxygen gas having a flow rate of approximately 1000 sccm (i.e., Standard Cubic Centimeter per Minute); and, helium gas having a flow rate of approximately 300 sccm, so that the tantalum oxide film was formed in the reactor container. The properties of the tantalum oxide film thus formed with the use of the first source gas was represented by a linear graph (1) of FIG. 7. On the other hand, when a second source gas which is similar to the first source gas except that the second source gas is free from oxygen was used in forming the tantalum oxide film, the properties of the tantalum oxide film thus formed with the use of the second source gas was represented by a linear graph (2) of FIG. 7. In the above, the oxygen gas was used to stabilize formation of the tantalum oxide film in its initial film forming stage.

As is clear from FIG. 7, irrespective of the presence of the oxygen gas, the coverage of the tantalum oxide film represented by each of the linear graphs (1) and (2) gradually decreases in a region of the film-forming pressure of more than approximately 0.1 Torr, provided that it is possible for the tantalum oxide film to be excellent in physical properties, i.e., to have a film coverage of more than approximately 90 percent when its film-forming pressure is approximately up to 0.5 Torr. As is clear from the same diagram of FIG. 7, the coverage of the tantalum oxide film drops rapidly in the linear graph (1) (which represents the coverage of the tantalum oxide film formed with use of the second source gas free from the oxygen gas) far more than in the linear graph (2) representing the tantalum oxide film formed with use of the first source gas containing the oxygen gas. The reason of the above is as follows:

Namely, in a lower range of the film forming pressure of the tantalum oxide film, when the volume of the source gas to be fed to the reactor container in unit time is constant, a flow rate or velocity of the source gas increases as the film forming pressure decreases, which facilitates the supply of the source gas to the surface of the semiconductor substrate, and increases molecules of the source gas in mean free path to improve the tantalum oxide film in coverage. Further, when the second source gas free from the oxygen gas is used, reaction in gas phase is suppressed, which enhances reaction in the surface of the semiconductor substrate. Consequently, the tantalum oxide film formed under a high film forming pressure is improved in coverage.

As a result, as is clear from FIG. 7, irrespective of the presence of the oxygen gas, it is possible to improve the tantalum oxide film in coverage when the tantalum oxide film is formed under a low film forming pressure of from 0.1 to 0.5 Torr. The above fact has been confirmed through the inventor's experiments.

Experiment Results 2

Figure 8:
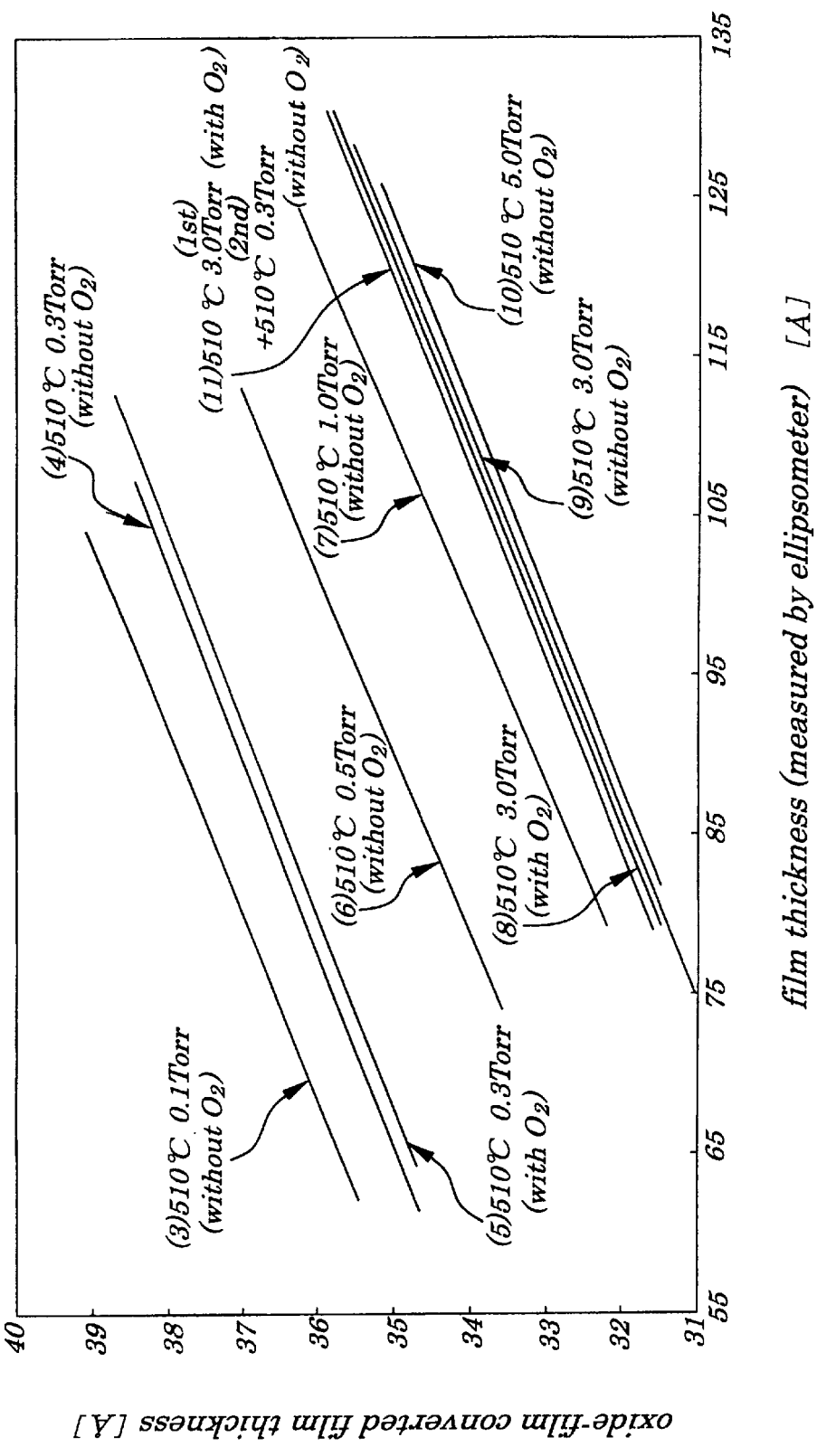
FIG. 8 is a diagram showing how the oxide-film converted film thickness (i.e., so-called "equivalent oxide thickness") varies as the film thickness (measured by the ellipsometer) goes from 55 to 135 Angstroms, which is used to describe the principles of the present invention.

As for the tantalum oxide film, the fact that its film quality is dependent on its film thickness was confirmed by forming the tantalum oxide film through the inventor's experiments, the results of which are shown in a diagram of FIG. 8. In this diagram of FIG. 8: the vertical axis represents in Angstrom an oxide-film converted film thickness; and, the horizontal axis represents a film thickness measured in Angstrom by an ellipsometer, wherein the oxide-film converted film thickness, as is defined in the above, corresponds to a capacitance of a microelectronic capacitor formed in the semiconductor device. More specifically, the capacitance of the capacitor increases as the oxide-film converted film thickness decreases. As for the film forming conditions of the tantalum oxide film, the film forming temperatures, and the types and the flow rates of the source gases used in the diagram of FIG. 8 are similar to those used in the diagram of FIG. 7.

In the diagram of FIG. 8: a linear graph (3) represents the oxide-film converted film thickness of the tantalum oxide film, which is formed under a film forming pressure of approximately 0.1 Torr with the use of the second source gas free from the oxygen gas; a linear graph (4) represents the oxide-film converted film thickness of the tantalum oxide film, which is formed under a film forming pressure of approximately 0.3 Torr with the use of the second source gas free from the oxygen gas; a linear graph (5) represents the oxide-film converted film thickness of the tantalum oxide film, which is formed under a film forming pressure of approximately 0.3 Torr with the use of the first source gas containing the oxygen gas; a linear graph (6) represents the oxide-film converted film thickness of the tantalum oxide film, which is formed under a film forming pressure of approximately 0.5 Torr with the use of the second source gas free from the oxygen gas; a linear graph (7) represents the oxide-film converted film thickness of the tantalum oxide film, which is formed under a film forming pressure of approximately 1.0 Torr with the use of the second source gas free from the oxygen gas; a linear graph (8) represents the oxide-film converted film thickness of the tantalum oxide film, which is formed under a film forming pressure of approximately 3.0 Torr with the use of the first source gas containing the oxygen gas; a linear graph (9) represents the oxide-film converted film thickness of the tantalum oxide film, which is formed under a film forming pressure of approximately 3.0 Torr with the use of the second source gas free from the oxygen gas; and, a linear graph (10) represents the oxide-film converted film thickness of the tantalum oxide film, which is formed under a film forming pressure of approximately 5.0 Torr with the use of the second source gas free from the oxygen gas.

As is clear from the diagram of FIG. 8, irrespective of the presence of the oxygen gas, the tantalum oxide film formed under a low film forming pressure of from 0.1 to approximately 0.5 Torr (which is a preferable film forming pressure to improve the tantalum oxide film in coverage in the diagram of FIG. 7) is increased in oxide-film converted film thickness, and is therefore poor in film quality. On the other hand, irrespective of the presence of the oxygen gas, the tantalum oxide film formed under a high film forming pressure of from 1.0 to 10 Torr (which makes the tantalum oxide film poor in coverage in the diagram of FIG. 7) is decreased in oxide-film converted film thickness, and is therefore improved in film quality.

In other words, as is clear from FIGS. 7 and 8, in forming the tantalum oxide film, it is recognized that a sufficient value of the coverage is incompatible with the improvement in film quality with respect to the film forming pressure. Further, in the diagram of FIG. 8, it is noted that all the linear graphs (3) to (10) are substantially similar to each other in inclination angle to extend in parallel with each other, which means that the dielectric constant of the tantalum oxide film is kept substantially constant in a range of its film thickness exceeding a predetermined value. In other words, a lower portion of the tantalum oxide film formed in a initial stage of the film formation process is different in film quality from an upper portion of the tantalum oxide film formed on the lower portion, which suggests the presence of a low-dielectric-constant film. Such a low-dielectric-constant film is hard to modify in physical properties even when the low-dielectric-constant film is subjected to a property modifying process disclosed in the above Japanese Patent Laid-Open No. Hei 9-121035.

In view of the above facts, considered as a hint to the present invention is the fact that: the first tantalum oxide film excellent in coverage may be formed under the low film forming pressure of from 0.1 to 0.5 Torr; and, the second tantalum oxide film excellent in film quality may be formed under the high film forming pressure of from 1.0 to 10 Torr. Consequently, the first and the second tantalum oxide film are combined with each other to form a double-layered tantalum oxide film, the physical properties of which are represented by a linear graph (11) of the diagram shown in FIG. 8. The linear graph (11) represents the physical properties of the double-layered tantalum oxide film comprising: a first layer formed under a high film forming pressure of approximately 3.0 Torr with the use of the source gas containing the oxygen gas in a first film forming step; and, a second layer formed on the first layer in a second film forming step in which the second layer is formed under a low film forming pressure of approximately 0.3 Torr with the use of the second source gas free from the oxygen gas. The linear graph (11) shows the fact that: in the double-layered tantalum oxide film, it is possible to have its excellent film quality be compatible with its excellent coverage due to the presence each of the first and the second layer, which are formed under the high and the low film forming pressure in the first and the second film forming step, respectively.

Experiment Results 3

Figure 6:
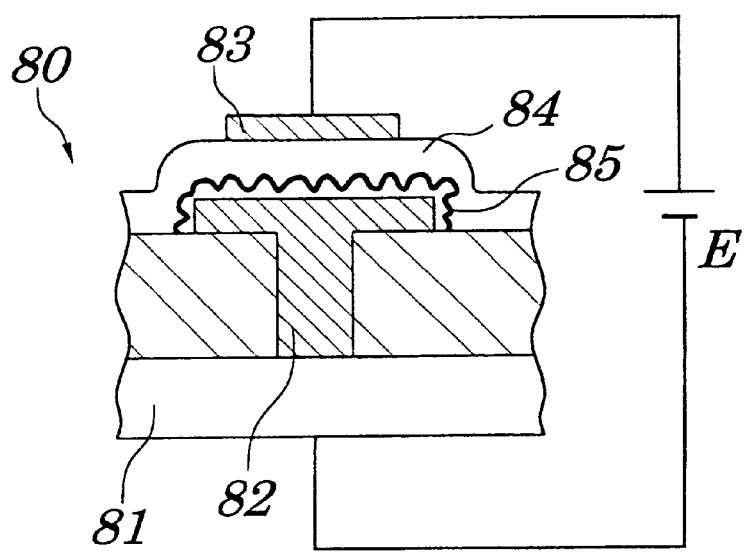
FIG. 6 is an enlarged cross sectional view of a microelectronic capacitor formed in a semiconductor device for determining a leakage current of a tantalum oxide film serving as a capacitance insulation film for the microelectronic capacitor in the semiconductor device, which is used to describe the principles of the present invention.
Figure 9:
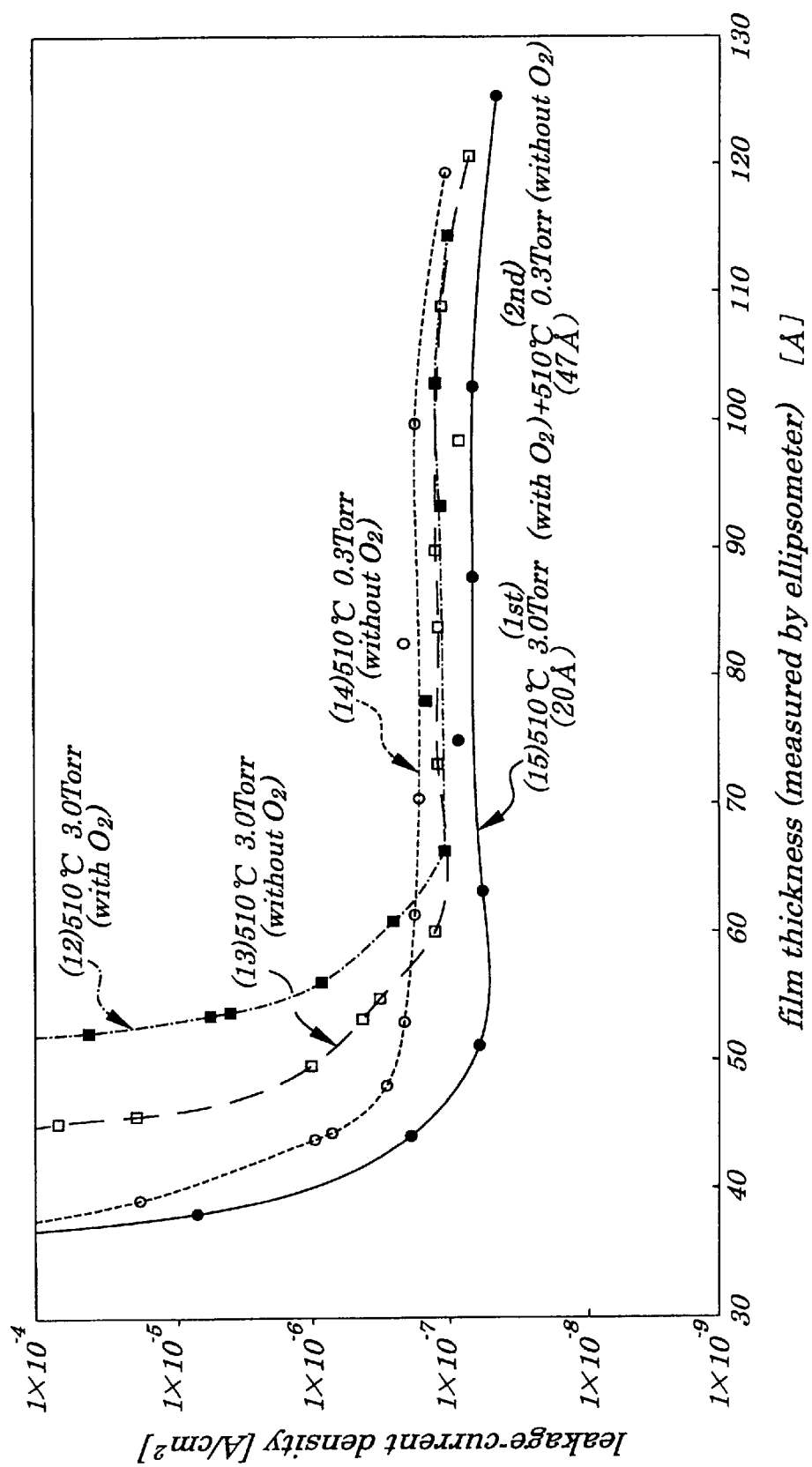
FIG. 9 is a diagram showing how the leakage-current density varies as the film thickness (measured by the ellipsometer) goes from 30 to 130 Angstroms, which is used to describe the principles of the preset invention.

The dependence in density of a leakage current (which occurs in the tantalum oxide film formed in each of the above-mentioned first and the second film forming step) upon a film thickness of the thus formed tantalum oxide film was confirmed through a plurality of experiments carried out by the inventor, the film thickness being measured by an ellipsometer (not shown). The results of the above experiments are shown in the diagram of FIG. 9, wherein: the vertical axis represents the leakage current density ($A/cm^2$); the horizontal axis represents the film thickness (Angstroms) of the tantalum oxide film measured by the ellipsometer. Here, as shown in FIG. 6, a microelectronic capacitor 80 in which a tantalum oxide film 84 is used as a capacitance insulation film was formed to measure a leakage current of the capacitor 80. As is clear from FIG. 6, the capacitor 80 has a construction in which: the tantalum oxide film 84 is formed between a lower electrode 82 and an upper electrode 83, the lower electrode 82 being formed on the semiconductor substrate 81; and, a conductive layer 85 is formed to cover the exposed surface of the lower electrode 82, and increased in surface area through its rough surface structure which is a so-called HSG (i.e., Hemispherical Grain) structure, wherein the conductive layer 85 (hereinafter referred to as the HSG conductive layer) is entirely covered with the tantalum oxide film 84. The leakage current density occurring in the capacitor 80 was measured by applying a voltage E of +1.2 volts between the semiconductor substrate 81 and the upper electrode 83. Incidentally, the film thickness represented on the horizontal axis in each of the diagrams of FIGS. 8 and 9 includes a film thickness of an RTN (i.e., Rapid Thermal Nitridation) film, a film thickness of which is approximately 18 Angstroms before formation of the tantalum oxide film. Further, this RTN film is formed to prevent the tantalum oxide film from reacting with silicon, as described later in detail.

In the diagram shown in FIG. 9: a linear graph (12) shows the physical properties of the tantalum oxide film formed under a film forming pressure of approximately 3.0 Torr with the use of the first source gas containing the oxygen gas; a linear graph (13) shows the physical properties of the tantalum oxide film formed under a film forming pressure of approximately 3.0 Torr with the use of the second source gas free from the oxygen gas; a linear graph (14) shows the physical properties of the tantalum oxide film formed under a film forming pressure of approximately 0.3 Torr with the use of the second source gas free from the oxygen gas; and, a linear graph (15) shows the physical properties of a double-layered tantalum oxide film. This double-layered tantalum oxide film has a construction in which: in the first film forming step, the first layer of tantalum oxide having a film thickness of approximately 20 Angstroms is formed under the first film forming pressure of approximately 3.0 Torr with the use of the first source gas containing the oxygen gas; and, the second layer of tantalum oxide having a film thickness of approximately 47 Angstroms is then formed on the first layer under the second film forming pressure of approximately 0.3 Torr with the use of the second source gas free from the oxygen gas. With respect to its film forming conditions, the double-layered tantalum oxide film represented by the linear graph (15) of FIG. 9 corresponds to that represented by the linear graph (11) of FIG. 8.

As is clear from FIG. 9, in a range the film thickness of more than approximately 60 Angstroms on the horizontal axis representing the film thickness of the tantalum oxide film measured by the ellipsometer, the tantalum oxide film formed under the high film forming pressure and having its physical properties represented by each of the linear graphs (12) and (13) is smaller in leakage current density than the tantalum oxide film formed under the low film forming pressure and having its physical properties represented by the linear graphs (14). On the other hand, in a range of the film thickness of less than approximately 60 Angstroms, the former the physical properties of which is represented by each of the linear graphs (12) and (13) is much larger in leakage current density than the latter the physical properties of which is represented by the linear graphs (14). This is because the tantalum oxide film formed under the high film forming pressure is poor in coverage. On the other hand, the reason why, in the range of the film thickness of more than approximately 60 Angstroms, the tantalum oxide film formed under the low film forming pressure and having its physical properties represented by the linear graph (14) is larger in leakage current density than the tantalum oxide film formed under the high film forming pressure and having its physical properties represented by each of the linear graphs (12) and (13), is that: as described above, a layer formed in the initial film forming stage of the tantalum oxide film is small in dielectric constant and contains a large amount of electron traps, and therefore poor in film quality, which makes its physical properties as to leakage current density poor. Further, in a range of the film thickness of from 60 to 120 Angstroms on the horizontal axis of the diagram of FIG. 9, the dependence of the leak current density on the film thickness is very small. In view of this fact, it is considered that the RTN film forming a substrate of the tantalum oxide film essentially acts to prevent the leakage current from occurring in the capacitor.

Experiment Results 4

Figure 10:
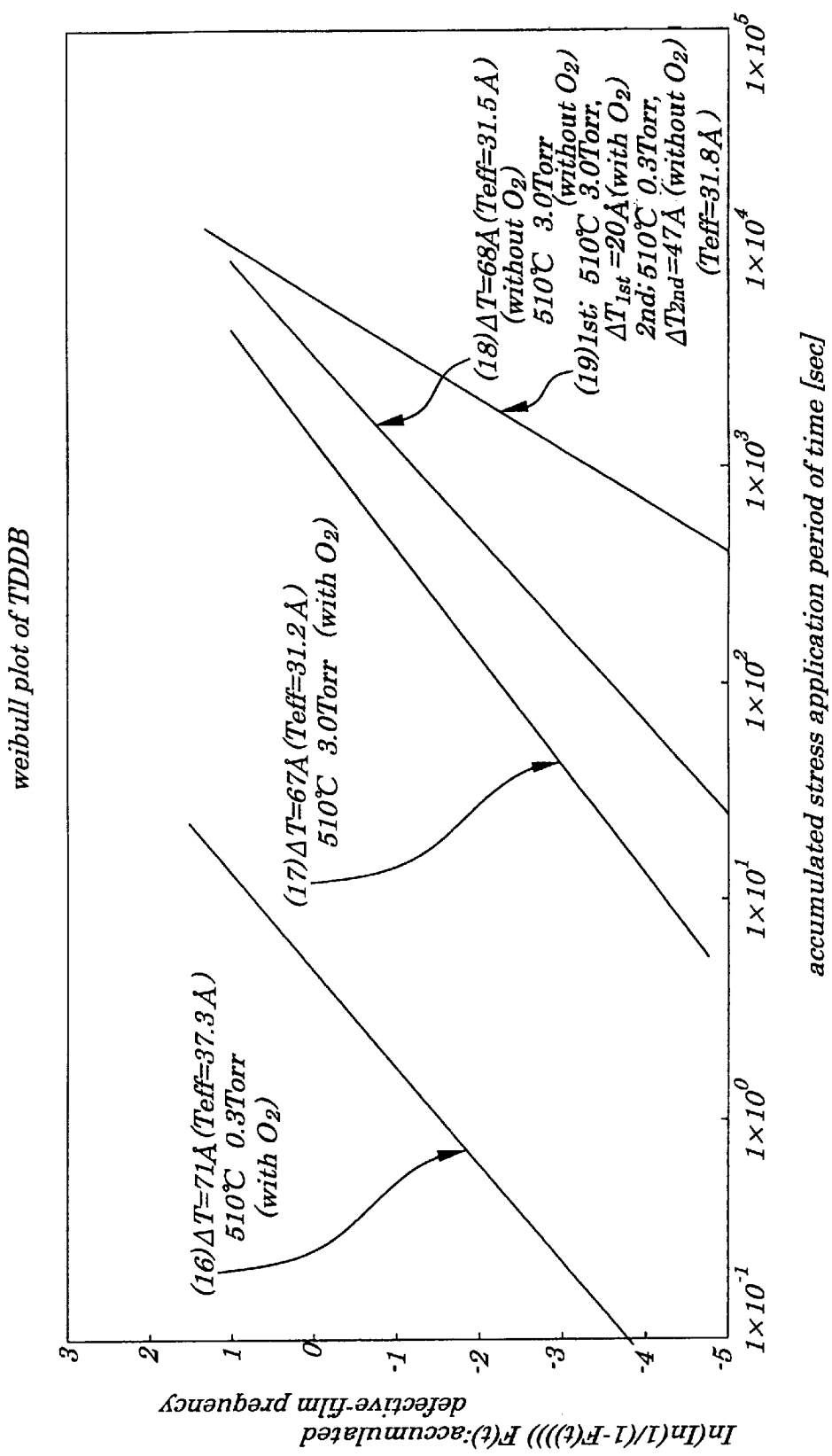
FIG. 10 is a diagram showing how the accumulated defective-film frequency varies as the accumulated stress application period of time goes from $1 \times 10^{-1}$ to $1 \times 10^5$ seconds, which is used to describe the principles of the present invention.

FIG. 10 shows the Weibull plot for the accumulated defective-film frequency F(t) (which is represented on the vertical axis) against the accumulated stress application period of time (represented on the horizontal axis) as to the TDDB (i.e., Time Dependent Dielectric Breakdown) characteristics of the tantalum oxide films formed under the high and the low film forming pressure, respectively. The Weibull plot of FIG. 10 was obtained in the following conditions using the microelectronic capacitor 80 shown in FIG. 6: a voltage applied to the capacitor 80 is +6.6 volts; a criterion voltage is +1.5 volts; criterion current is $1 \times 10^{-5}$ $A/cm^2$; and, a temperature of the atmosphere is 25° C. Incidentally, in the diagram of FIG. 10: ΔT is an increment in film thickness of the tantalum oxide film when the tantalum oxide film is formed on a silicon substrate (which has been already treated with an HF added pure water, and then subjected to an RTN treatment in an atmosphere of ammonia gas at a temperature of from 870 to 980° C. for a time period of one minute). In this case, the film thickness of the RTN film before formation of the tantalum oxide film thereon was approximately 18 Angstroms.

In the diagram of FIG. 10, a linear graph (16) represents the physical properties of the tantalum oxide film formed under a low film forming pressure of approximately 0.3 Torr with the used of the first source gas containing the oxygen gas, wherein: ΔT (i.e., the increment in film thickness of the tantalum oxide film when the tantalum oxide film is formed on the silicon substrate) is approximately 71 Angstroms; and, the oxide-film converted film thickness (i.e., equivalent oxide thickness) Teff is approximately 37.3 Angstroms. In the same diagram of FIG. 10, another linear graph (17)

represents the physical properties of the tantalum oxide film formed under a high film forming pressure of approximately 3.0 Torr with the used of the first source gas containing the oxygen gas, wherein: ΔT is approximately 67 Angstroms; and, Teff is approximately 31.2 Angstroms. Further another linear graph (18) represents the physical properties of the tantalum oxide film formed under a high film forming pressure of approximately 3.0 Torr with the used of the second source gas free from the oxygen gas, wherein: ΔT is approximately 68 Angstroms; and, Teff is approximately 31.5 Angstroms.

Also in the same diagram of FIG. 10, still further another linear graph (19) represents the physical properties (i.e., Teff: approximately 31.8 Angstroms) of a double-layered tantalum oxide film constructed of a first and a second layer. The first layer of the double-layered tantalum oxide film (i.e., first tantalum oxide film) is formed under a high film forming pressure of approximately 3.0 Torr with the used of the first source gas containing the oxygen gas in the first film forming step, wherein ΔT is approximately 20 Angstroms. On the other hand, the second layer of the double-layered tantalum oxide film (i.e., second tantalum oxide film) is formed on the first tantalum oxide film under a low film forming pressure of approximately 0.3 Torr with the used of the second source gas free from the oxygen gas in the first film forming step, wherein ΔT is approximately 47 Angstroms. The double-layered tantalum oxide film represented by the linear graph (19) corresponds in film forming condition to that represented by each of the linear graph (11) of FIG. 8 and the linear graph (15) of FIG. 9.

As is clear from the diagram of FIG. 10, the double-layered tantalum oxide film represented by the linear graph (19) provided with the first layer formed under the high film forming pressure and the second layer formed under the low film forming pressure may take a figure up approximately three places in durability relative to the tantalum oxide film represented by the linear graph (16) formed under the low film forming pressure. Further, the linear graph (19) representing the double-layered tantalum oxide film is larger in inclination angle than the linear graph (17) representing the physical properties of the tantalum oxide film which is poor in coverage, as described above. This means that the double-layered tantalum oxide film represented by the linear graph (19) is excellent in durability. As for another tantalum oxide film represented by the linear graph (18), although it is inferior to the double-layered tantalum oxide film of the linear graph (19) in physical properties, it is better than the tantalum oxide film of the linear graph (17) in effect.

Consequently, according to this experiment, it has been recognized that: in case that the tantalum oxide film is formed, it is possible to improve in film quality the tantalum oxide film by forming the double-layered tantalum oxide film formed through the first and the second film forming steps, wherein the first film forming step is performed at the high film forming pressure while the second film forming step is performed at the high film forming pressure, and also possible to improve in film quality the tantalum oxide film by forming a tantalum oxide film such as one represented by the linear graph (18), which one is formed through a single film forming step performed under an appropriate film forming pressure at an appropriate film forming temperature. Through the above experiment in which the film forming pressure was within a range of from 1 to 10 Torr and the film forming temperature was within a range of from 500 to 560° C., the substantially same result as that obtained in the tantalum oxide film represented by the linear graph (18) of FIG. 10 was obtained. Under the above film forming conditions, the tantalum oxide film having a film thickness of from 60 to 120 was successfully obtained.

Figure 11A:
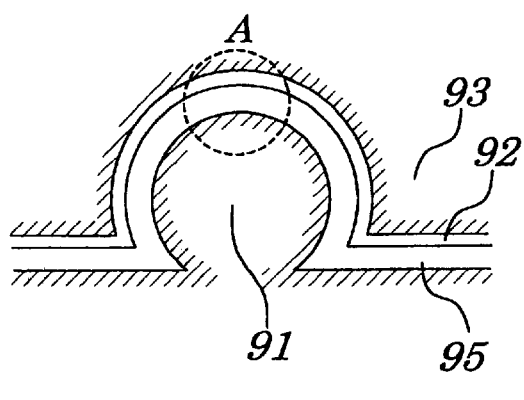
FIGS. 11A and 11B are enlarged cross sectional views of an essential part of the semiconductor device fabricated according to the method of the present invention, illustrating the tantalum oxide film formed under a low film forming pressure of from 0.1 to 0.5 Torr, which is used to describe the principles of the present invention.
Figure 11B:
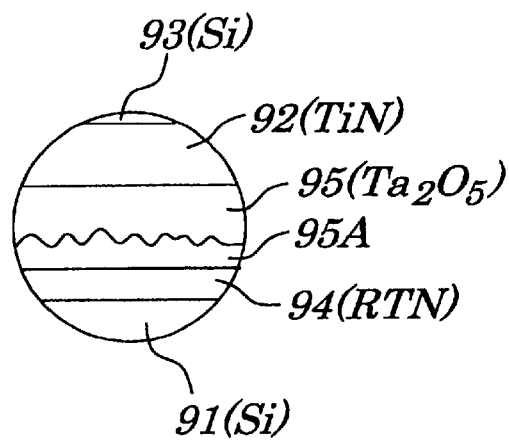
Figure 12A:
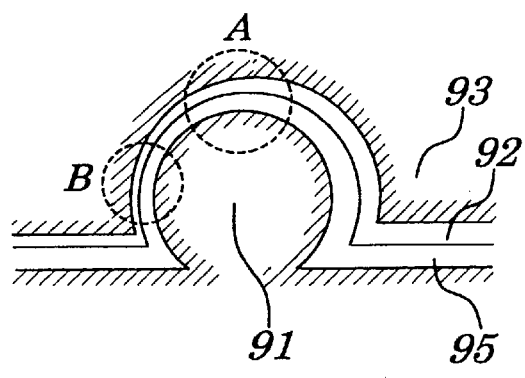
FIGS. 12A and 12B are enlarged cross sectional views of an essential part of the semiconductor device fabricated according to the method of the present invention, illustrating the tantalum oxide film formed under a high film forming pressure of from 1.0 to 10 Torr, which is used to describe the principles of the present invention.
Figure 12B:
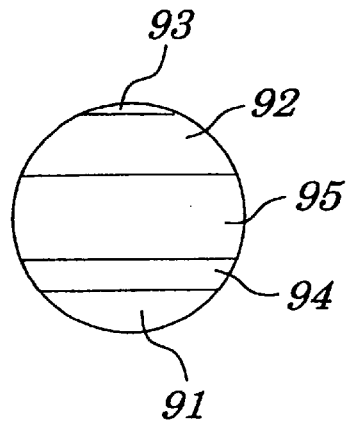
Figure 13A:
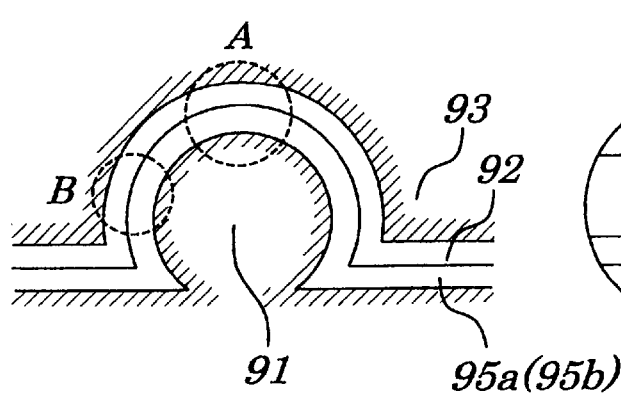
FIGS. 13A and 13B are enlarged cross sectional views of an essential part of the semiconductor device fabricated according to the method of the present invention, illustrating the first tantalum oxide film formed under a high film forming pressure of from 1.0 to 10 Torr and the second tantalum oxide film formed on the first tantalum oxide film under a lower film forming pressure of from 0.1 to 0.5 Torr, which is used to describe the principles of the present invention.
Figure 13B:
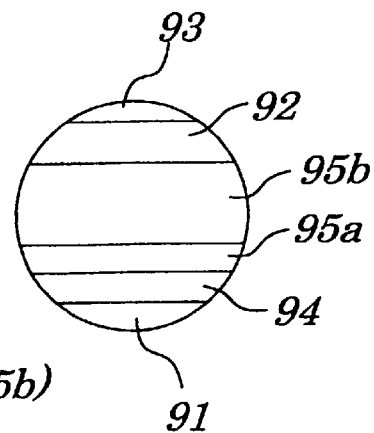
Figure 14A:
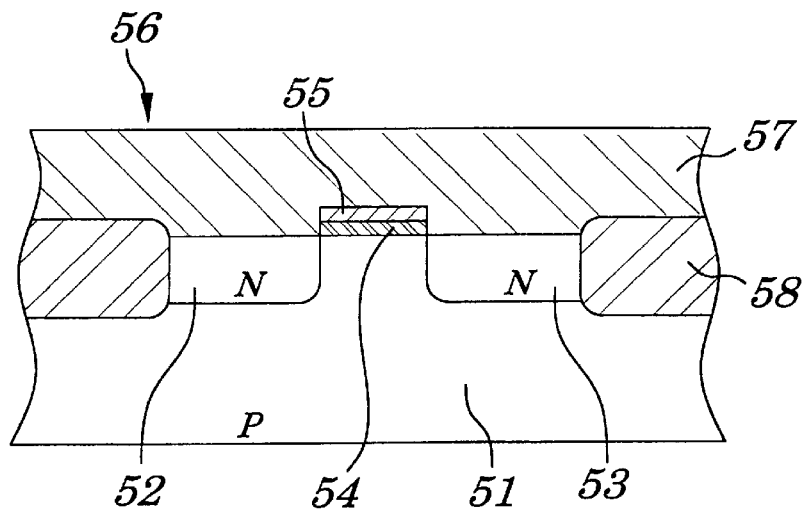
FIGS. 14A and 14C are cross sectional views of a semiconductor device fabricated according to a conventional method, illustrating a series of process steps for forming a microelectronic capacitor in the semiconductor device.
Figure 14B:
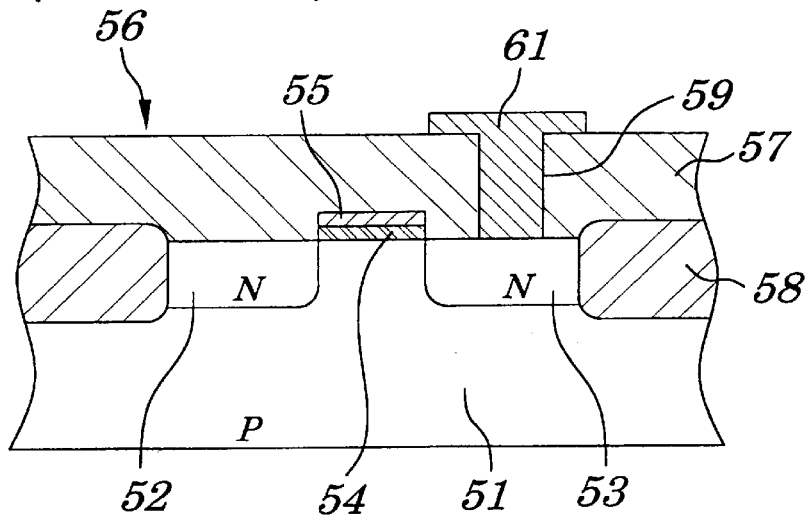
Figure 14C:
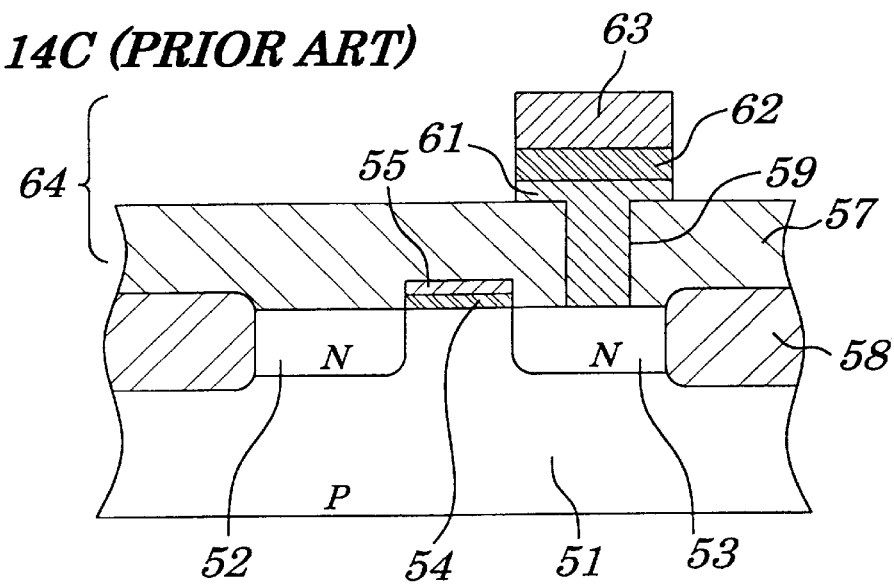

FIGS. 11A, 12A and 13B show cross-sectional views of a schematic capacitor model of the microelectronic storage capacitor structure based on the above experiment results 1 to 4 in the present invention. On the other hand, FIGS. 11B, 12B and 13B are partially enlarged view of the cross sections of the capacitor model shown in FIGS. 11A, 12A and 13B, respectively. In the drawings: the reference numeral 91 denotes a silicon film (i.e., HSG film) serving as the capacitor lower electrode; 92 denotes a titanium nitride film (i.e., TiN) serving as the capacitor upper electrode; 93 denotes a silicon film; 94 and 95 denote an RTN film (i.e., SiON film) and a tantalum oxide film each serving as a capacitance insulation film, respectively; 95A denotes a low-dielectric-constant film formed in the initial film forming stage in forming the tantalum oxide film 95.

FIGS. 11A and 11B show the cross-sectional views of the tantalum oxide film 95, which is formed under the low film forming pressure ranging from 0.1 to 5 Torr. Although the tantalum oxide film 95 thus formed is excellent in coverage, since it is provided with the low-dielectric-constant film 95A, the tantalum oxide film 95 is disadvantageous in increasing the capacitor in capacitance and particularly in reliability, due to the presence of the low-dielectric-constant film 95A.

FIGS. 12A and 12B show the cross-sectional views of the tantalum oxide film 95, which is formed under the high film forming pressure ranging from 1.0 to 10 Torr. Although the tantalum oxide film 95 thus formed is excellent in film quality since the low-dielectric-constant film 95A is hard to form therein. However, in an area B encircled with a dotted line in FIG. 12A, a film poor in coverage is formed, which increases the leakage current. Due to this, it is hard to reduce in film thickness the thus formed tantalum oxide film 95. Further, since the tantalum oxide film 95 of this type is poor in coverage, the TDDB (i.e., Time Dependent Dielectric Breakdown) characteristics of this tantalum oxide film 95 is small in inclination angle in its linear graph, which impairs the capacitor in reliability.

FIGS. 13A and 13B show the cross-sectional views of the double-layered tantalum oxide film constructed of: the first tantalum oxide film 95a formed under the high film forming pressure (which ranges from 1 to 10 Torr) in the first film forming step according to the principles of the present invention; and, the second tantalum oxide film 95b formed under the low film forming pressure (which ranges from 0.1 to 0.5 Torr) in the second film forming step according to the principles of the present invention. The thus formed double-layered tantalum oxide film (95a, 95b) is excellent both in coverage and in film quality. Particularly, in an area B encircled with a dotted line in FIG. 13A, the double-layered tantalum oxide film is improved in coverage, which makes it possible for the double-layered tantalum oxide film (95a, 95b) to have is film thickness reduced up to a range of from 50 to 60 Angstroms.

Further, according to the other principles of the present invention, it is also possible to realize an improvement in film quality of the tantalum oxide film. In other words, it is possible to produce a desirable one of the tantalum oxide film having a film thickness of from 60 to 120 Angstroms through even a single film forming step by setting the film forming pressures and the film forming temperatures in a preferable pressure range of from 1 to 10 Torr and in a preferable temperature range of from 500 to 560° C., respectively.

Now, with reference to FIGS. 1A to 3B of the accompanying drawings, preferred embodiments of the method of the present invention for manufacturing the semiconductor device will be described on the basis of the principles of the present invention.

First Embodiment

FIGS. 1A to 3B show a first embodiment of the method of the present invention for manufacturing the semiconductor device, illustrating a plurality of film forming steps of the method of the present invention. Now, the first embodiment of the present invention will be described in the order of the film forming steps.

First, as shown in FIG. 1A, according to the prior art, for example, formed on a P-type semiconductor substrate 1 are: an N-type source region 2 and an N-type drain region 3; a gate insulation film 4 formed on a region interposed between the source region 2 and the drain region 3; and a gate electrode 5 formed on the gate insulation film 4, so that an N-type MOS transistor 6 is formed. In the same manner as that described above, a plurality of the N-type MOS transistors 6 are formed on the same semiconductor substrate 1, wherein adjacent ones of the transistors 6 are isolated from each other through an element isolating insulation film 7. Each of the N-type MOS transistor 6 is coupled with a microelectronic storage capacitor 21 (shown in FIG. 3B) to form a memory cell. In the process step shown in FIG. 11A, after formation of the gate electrode 5, an interlayer insulation film 8 made of a suitable material such as silicon oxide, silicon nitride and the like is formed by a CVD process to entirely cover an upper surface of the semiconductor device including the gate electrode 5.

Figure 1B:
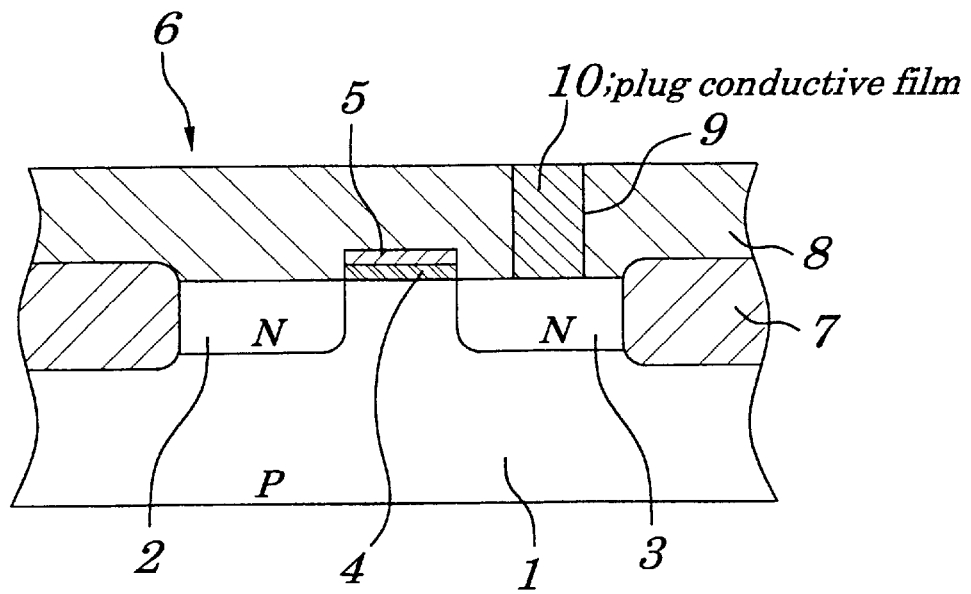

After that, as shown in FIG. 1B, a minute contact hole 9 is formed in the interlayer insulation film 8 on the N-type drain region 6 (or, the N-type source region 2) of the N-type MOS transistor 6 by a lithography process. After that, a conductive film such as a polysilicon film doped with a suitable impurity such as arsenic, phosphorus and the like is formed by a CVD process to entirely cover an upper surface of the interlayer insulation film 8 including the contact hole 9. Then, an unnecessary portion of this conductive film, except one formed inside the inner the contact hole 9 to become a plug conductive film 10, is removed by an etching process.

Figure 2A:
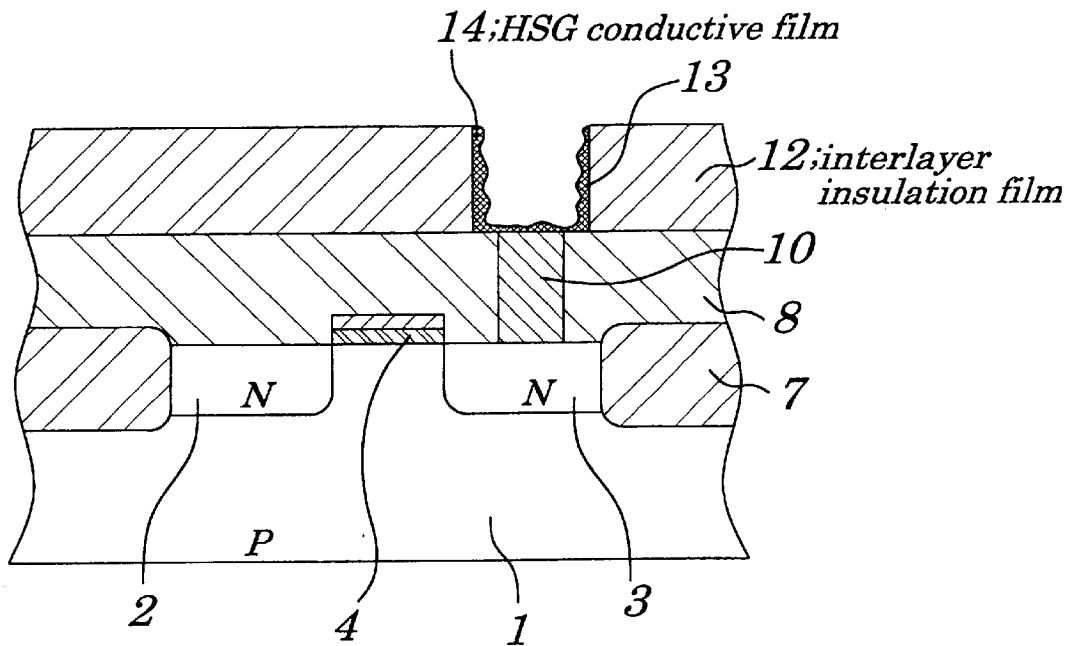
FIGS. 2A and 2B are cross sectional views of the semiconductor device shown in FIGS. 1A and 1B, wherein another contact hole is formed and then coated with an HSG (i.e., Hemispherical Grain) conductive silicon film.
Figure 2B:
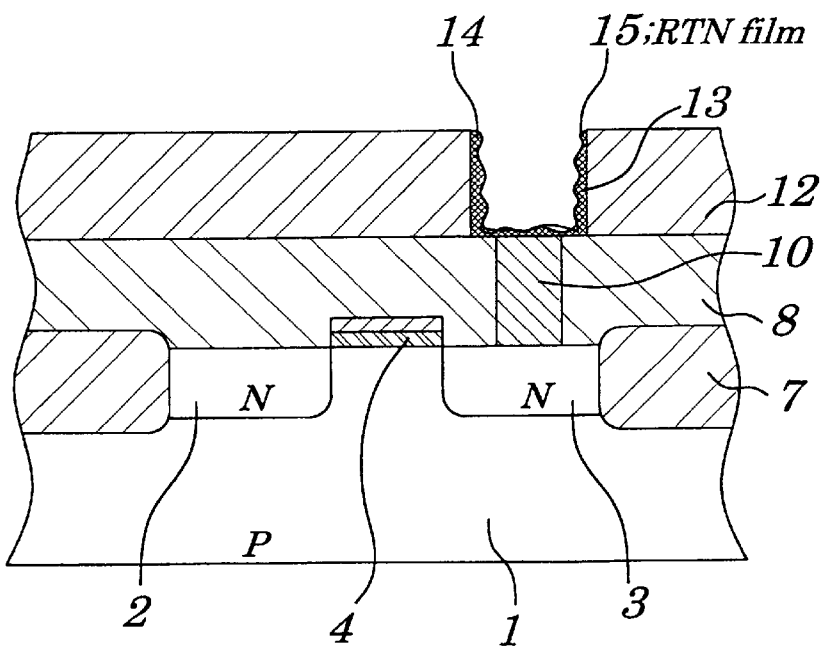

After that, as shown in FIG. 2A, another interlayer insulation film 12 made of a suitable material such as NSG (i.e., Non-doped Silicon Glass) and the like is formed by the CVD process to entirely cover an upper surface of the interlayer insulation film 8 including the plug conductive film 10. Then, another minute contact hole 13 is formed in the interlayer insulation film 12 on the plug conductive film 10 by the lithography process. After that, another HSG conductive film 14 is formed by the CVD process to entirely cover an upper surface of the interlayer insulation film 12 including the contact hole 13. Then, an unnecessary portion of this HSG conductive film 14, except one formed inside the inner the contact hole 13, is removed by an etching process. The remaining HSG conductive film 14 formed inside the contact hole 13 forms an lower electrode of the capacitor 21 (shown in FIG. 3B). The surface of this lower electrode 14 is rough to assume grain-like shape in cross section in order to increase its surface area.

Figure 3A:
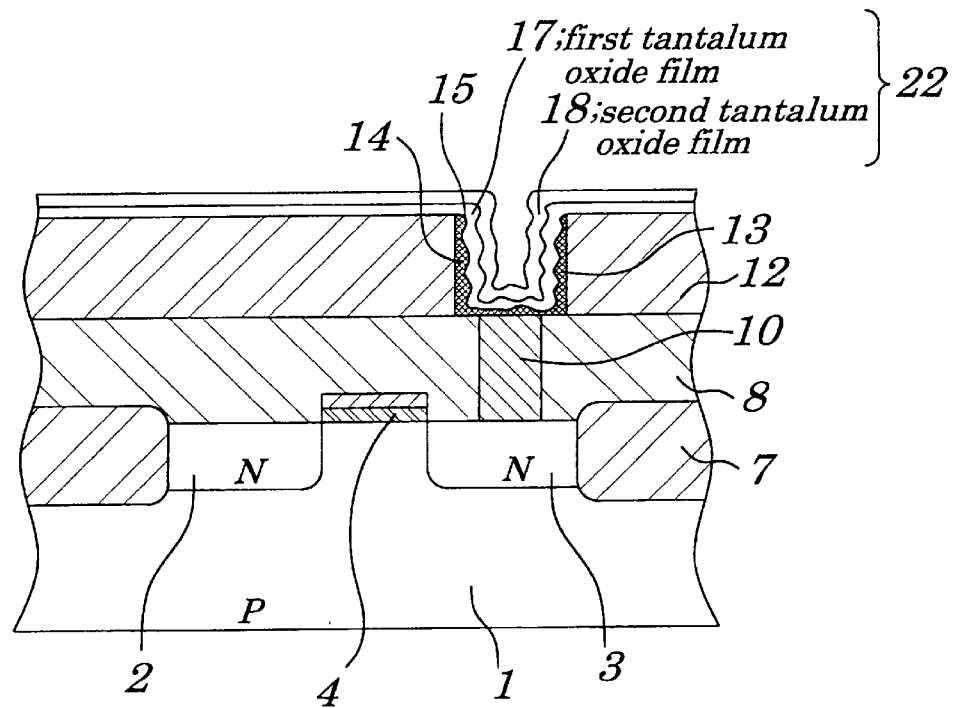
FIGS. 3A and 3B are cross sectional views of the semiconductor device shown in FIGS. 2A and 2B, wherein a first and a second tantalum oxide film are formed to cover an upper surface of the semiconductor device, then a titanium nitride film is formed to cover the second tantalum oxide film, and finally a doped polysilicon film is formed to cover the titanium nitride film.
Figure 3B:
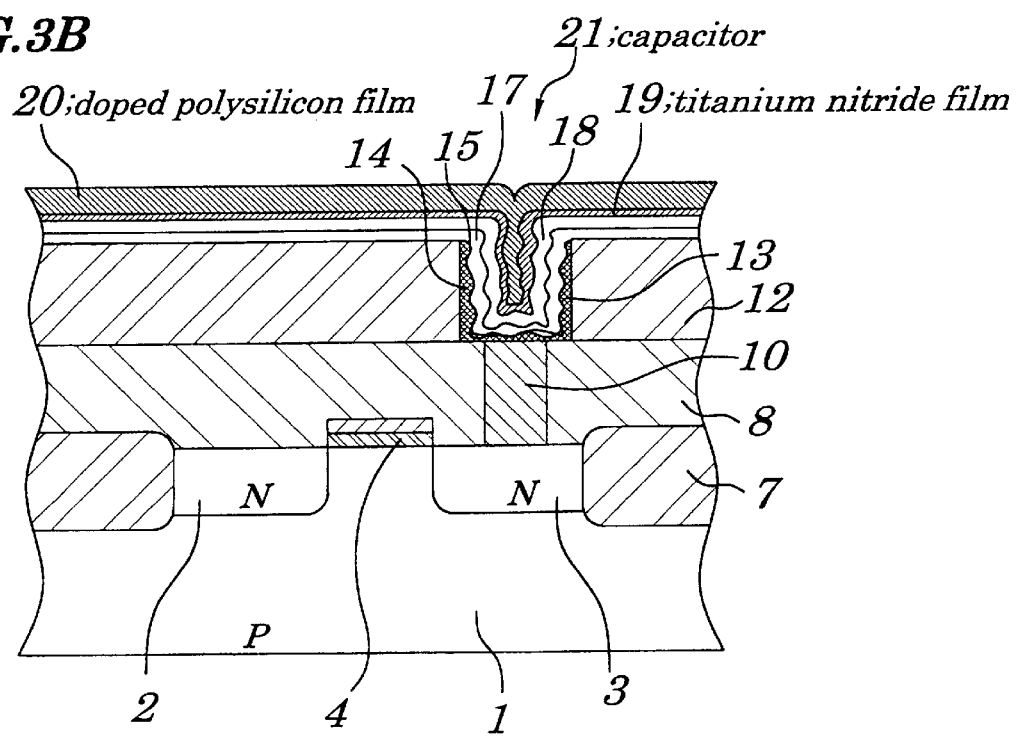

After completion of formation of the lower electrode 14 of the capacitor 21, as shown in FIG. 3B, a RTN film 15 is formed by a rapid thermal nitridation (i.e., RTN) process to cover the entire upper surface of the interlayer insulation film 12 including the surface of the lower electrode 14. After that, the double-layered tantalum oxide film 22 (shown in FIG. 3A) constructed of the first one 17 and the second one 18 is formed on the RTN film 15 to serve as a capacitance insulation film, according to the principles of the present invention as described above.

Namely, the double-layered tantalum oxide film 22 is formed under the same conditions as those used in forming the double-layered tantalum oxide film, the physical properties of which is represented by each of the linear graph (11) of FIG. 8, linear graph (15) of FIG. 9, and the linear graph (19) of FIG. 10.

More specifically, the double-layered tantalum oxide film 22 (shown in FIG. 3A) is formed through a first and a second film forming step. In the first film forming step performed for a time period of approximately five seconds, the first tantalum oxide film 17 having a film thickness of approximately 20 Angstroms is formed under the high film forming pressure of approximately 3.0 Torr at a film forming temperature of 510° C. with the use of the first source gas containing the oxygen gas. After completion of formation of the first tantalum oxide film 17, in the second film forming step subsequent to the first film forming step, the second tantalum oxide film 18 having a film thickness of approximately 50 Angstroms is formed in a time of approximately 60 seconds under the low film forming pressure of approximately 0.3 Torr at the film forming temperature of 510° C. with the use of the second source gas free from the oxygen gas to cover the first tantalum oxide film 17. Consequently, the total film thickness of the thus formed double-layered tantalum oxide film 22 is approximately 70 $\mu$m to serve as the capacitance insulation film of the capacitor 21 (shown in FIG. 3B).

The double-layered tantalum oxide film 22 thus formed under the above film forming conditions is excellent both in film quality and in coverage, and, therefore capable of serving as a highly reliable capacitance insulation film for the capacitor 21 even when it is sufficiently small in film thickness. Incidentally, although the RTN film 15 disposed adjacent to the double-layered tantalum oxide film 22 serves as an additional capacitance insulation film, the double-layered tantalum oxide film 22 plays a dominant role in serving as the capacitance insulation film in the capacitor 21.

After completion of formation of the double-layered tantalum oxide film 22 shown in FIG. 3A, the semiconductor device is subjected to an ultraviolet ray-ozone (i.e., UV-$O_3$) annealing treatment at a temperature of from 400 to 500° C. for a time period of five minutes, and then subjected to an oxygen (i.e., $O_2$) annealing treatment at a temperature of approximately 800° C. for a time period of ten minutes. After that, as shown in FIG. 3B, a titanium nitride film 19 having a film thickness of from 100 to 200 Angstroms is formed on the double-layered tantalum oxide film 22 by the CVD process. After that, a doped polysilicon film 20 having a film thickness of from 1300 to 1700 Angstroms is formed on the titanium nitride film 19 to cover the same, wherein the doped polysilicon film 20 is doped with a suitable impurity to have an impurity concentration of approximately $1 \times 10^{20}$/ $cm^3$, and serves as an upper electrode of the capacitor 21, as shown in FIG. 3B.

In a manner described above, as is clear from FIG. 3B, the capacitor 21 is constructed of: the lower capacitor electrode 14 formed of the HSG conductive film 14; the RTN film 15; the double-layered tantalum oxide film 33 which is constructed of the first tantalum oxide film 17 and the second tantalum oxide film 18 to serve as the capacitance insulation film of the capacitor 21; the titanium nitride film 19; and, the doped polysilicon film 20 serving as the upper electrode of the capacitor 21. The capacitor 21 thus formed is connected in series with the N-type MOS transistor 6 so that the memory cell is formed, whereby the semiconductor device of the present invention is completed.

As described above, in this embodiment of the method of the present invention having the above construction, in forming the double-layered tantalum oxide film 22 serving as the capacitance insulation film of the capacitor 21: in the first film forming step, the first tantalum oxide film 17 is formed under the high film forming pressure of approximately 3.0 Torr at the film forming temperature of 510° C. with the use of the first source gas containing the oxygen gas; and, after completion of formation of the first tantalum oxide film 17, in the second film forming step subsequent to the first film forming step, the second tantalum oxide film 18 is formed under the low film forming pressure of approximately 0.3 Torr at the film forming temperature of 510° C. with the use of the second source gas free from the oxygen gas to cover the first tantalum oxide film 17.

Consequently, the double-layered tantalum oxide film 22 thus formed under the above film forming conditions is excellent both in film quality and in coverage, and, therefore capable of serving as a highly reliable capacitance insulation film for the capacitor 21 even when it is sufficiently small in film thickness.

Second Embodiment

Now, a second embodiment of the method of the present invention for manufacturing the semiconductor device will be described in the order of its processing steps. This second embodiment of the present invention is substantially similar to the first embodiment of the present invention, except that the second embodiment of the present invention uses a single-layered tantalum oxide film 23 in place of the double-layered tantalum oxide film 22 of the first embodiment of the present invention, wherein the single-layered tantalum oxide film 23 is formed in a single film forming step. Incidentally, throughout the accompanying drawings, like reference numerals refer to like parts.

Figure 4A:
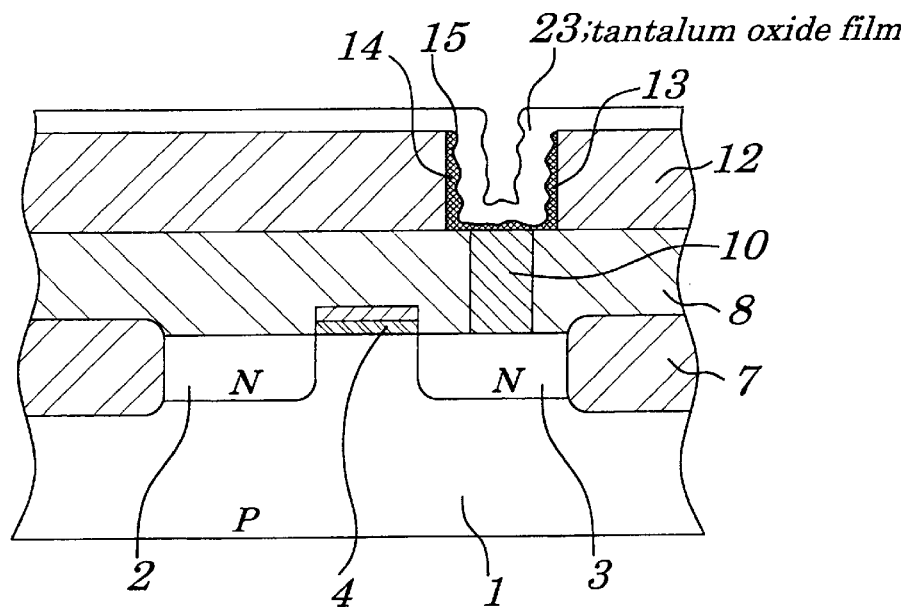
FIGS. 4A and 4B are cross sectional views of the semiconductor device fabricated according to a second embodiment of the method of the present invention, wherein a single-layered tantalum oxide film is formed instead of the double-layered tantalum oxide film of the first embodiment of the present invention to cover an upper surface of the semiconductor device, then a titanium nitride film is formed to cover this single-layered tantalum oxide film, and finally a doped polysilicon film is formed to cover the titanium nitride film.

In forming the semiconductor device according to the second embodiment of the method of the present invention, first, the semiconductor substrate 1 shown in FIG. 4A is prepared through the same process as that performed in the first embodiment of the present invention for preparing the same semiconductor substrate 1 shown in FIG. 2A.

Figure 4B:
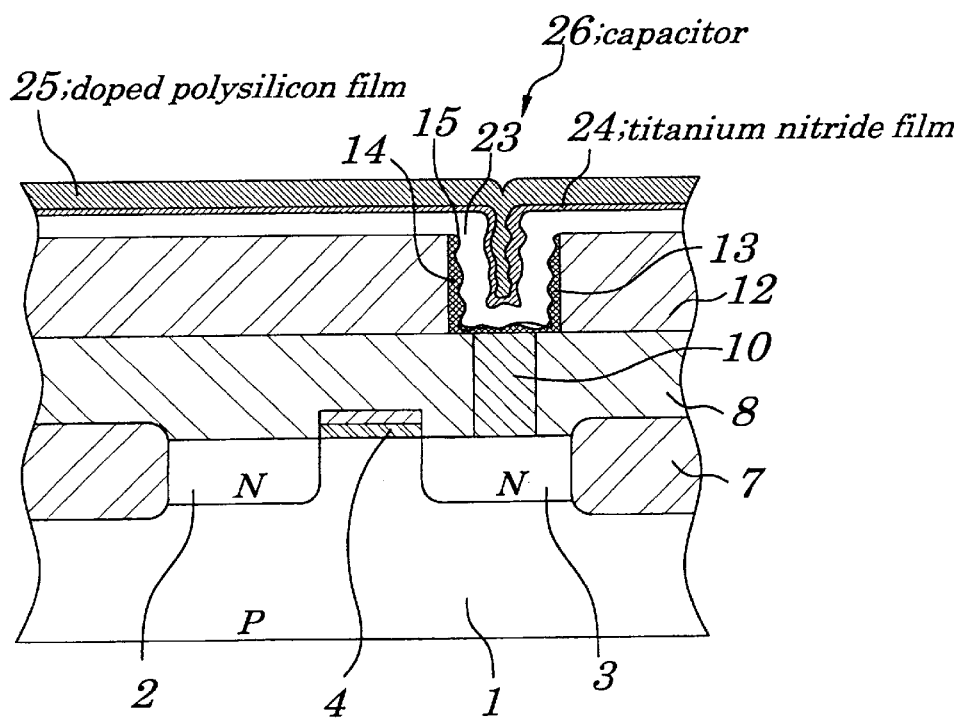

Then, as shown in FIG. 4A, in the single film forming step, the single-layered tantalum oxide film 23 is formed on the RTN film 15 by the CVD process to serve as a capacitance insulation film of a capacitor 26 shown in FIG. 4B. Such formation of the single-layered tantalum oxide film 23 is performed according to the other of the principles of the present invention described above.

More specifically, the single-layered tantalum oxide film 23 is formed under the same conditions as those used in forming the tantalum oxide film represented by the linear graph (18) of FIG. 10. Namely, in the second embodiment of the method of the present invention, the single-layered tantalum oxide film 23 having a film thickness of approximately 60 Angstroms is formed in a time of approximately 70 seconds under the high film forming pressure of approximately 3.0 Torr at the film forming temperature of 510° C. with the use of the second source gas free from the oxygen gas.

The single-layered tantalum oxide film 23 thus formed in the second embodiment of the present invention under the above conditions is improved in film quality in a range of film thickness of from 60 to 120 Angstroms, in comparison with the double-layered tantalum oxide film 22 formed in the first embodiment of the present invention shown in FIG. 3A.

Then, the ultraviolet-ozone annealing process is performed for approximately five minutes. After that, the oxygen annealing process is performed at a temperature of approximately 800° C. for five minutes to modify the single-layered tantalum oxide film 23 in its physical properties. Then, as shown in FIG. 4B, a titanium nitride film 24 having a film thickness of from 100 to 200 Angstroms is formed by the CVD process to cover the single-layered tantalum oxide film 23. Thereafter, a doped polysilicon film 25, which has an impurity concentration of approximately $1 \times 10^{20}/cm^3$ and a film thickness of from 1300 to 1700 Angstroms, is formed to cover this titanium nitride film 24, so that the doped polysilicon film 25 serves as an upper electrode of the capacitor 26.

As is clear from the above, the capacitor 26 thus formed is provided with: the lower electrode 14 formed of the HSG conductive film 14; the capacitance insulation film formed of both the RTN film 15 and the tantalum oxide film 23; and, the upper electrode (24, 25) formed of both the titanium nitride film 24 and the doped polysilicon film 25. Each of the capacitors 26 thus formed is connected in series with each of the N-type MOS transistors 6 to form each of the memory cells of the semiconductor device, so that the semiconductor device is completed according to the second embodiment of the method of the present invention.

As described above, in this second embodiment of the present invention having the above construction, even when the single-layered tantalum oxide film 23 having a relatively large film thickness is formed, it is possible to modify or improve the single-layered tantalum oxide film 23 in its physical properties.

In addition to the above, in the second embodiment of the present invention having the above construction, since the single-layered tantalum oxide film 23 is formed in the single film forming stage, it is possible to reduce the number of the process steps in manufacturing the semiconductor device of the present invention.

Although the first and the second embodiments of the method of the present invention have been described above with reference to the accompanying drawings, the present invention is not limited to these embodiments in construction. In other words, since various modifications and changes in designs may be made without departing from the spirit of the present invention, these modifications and changes in designs belong to the present invention. Although the source gas used in forming the tantalum oxide film is of pentaethoxy tantalum in the above embodiments of the present invention, any other suitable source gases may be used in addition to the above pentaethoxy tantalum (i.e., $(Ta(OC_2H_5)_5)$ gas, provided that these source gases are of suitable metal alkoxides such as pentamethoxy tantalum (i.e., $(Ta(OCH_3)_5)$, pantabutoxy tantalum (i.e., $(Ta(OC_3H_7)_5)$ and the like.

Further, in the method of the present invention having the above construction, it is also possible to use any other suitable films in addition to the silicon oxide film and the silicon nitride film as the interlayer insulation films, for example such as BSG (i.e., Boro-Silicate Glass) films, PSG (i.e., Phospho-Silicate Glass) films, BPSG (i.e., Boro-Phospho-Silicate Glass) films and the like. Still further, although the interlayer insulation film is a single-layer film in the above embodiments of the present invention, it may be a multilayered film which is constructed of a plurality of insulation films having been stacked into a pile. Further, the contact hole passing through the interlayer insulation film may be extended to pass through a third interlayer insulation film and others disposed under the third interlayer insulation film.

Further, although the tantalum oxide film grows on the lower electrode through the HSG conductive film, it is also possible for the present invention to form the tantalum oxide film directly on the lower electrode without using the HSG conductive film. Further, as for the conductive type, the P-type and the N-type are interchangeable with each other in the semiconductor areas of the semiconductor device fabricated according to the method of the present invention. Further, in the method of the present invention, any of the film forming temperatures, film forming pressures and the gas flow rates described in the above is only an example, and, therefore may be modified depending upon individual purposes and application areas.

It is thus apparent that the present invention is not limited to the above embodiments but may be changed and modified without departing from the scope and spirit of the invention.

Finally, the present application claims the Convention Priority based on Japanese Patent Application No. Hei 10-340684 filed on Nov. 30, 1998, which is herein incorporated by reference.

What is claimed is:

1. A method of manufacturing a semiconductor device in which a tantalum oxide film is formed on a semiconductor substrate by a chemical vapor deposition process with the use of a source gas containing a metal alkoxide, comprising:
   a first film forming step for forming a first tantalum oxide film under a first film forming pressure; and
   a second film forming step for forming a second tantalum oxide film to be stacked on said first film under a second film forming pressure which is lower than said first film forming pressure, wherein said second tantalum oxide film is combined with said first tantalum oxide film to form a double-layered tantalum oxide film.

2. The method of manufacturing the semiconductor device according to claim 1, wherein: pentaethoxy tantalum is used as said metal alkoxide.

3. The method of manufacturing the semiconductor device according to claim 1, wherein: said first film forming step is performed with the use of said source gas containing oxygen.

4. The method of manufacturing the semiconductor device according to claim 1, wherein: said first and/or said second of said tantalum oxide films are/is used as a capacitance insulation film.

5. The method of manufacturing the semiconductor device according to claim 1, wherein: said first film forming pressure is within a range of from 1 to 10 Torr; and, said second film forming pressure is within a range of from 0.1 to 0.5 Torr.

6. The method of manufacturing the semiconductor device according to claim 1, wherein: in said first film forming step, said first tantalum oxide film is formed to have a film thickness of from 10 to 30 Angstroms; and, in said second film forming step, said second tantalum oxide film is formed on said first film to have a film thickness of from 30 to 80 Angstroms.

7. The method of manufacturing the semiconductor device according to claim 1, wherein: after completion of formation of said first tantalum oxide film and said second tantalum oxide film, an ultraviolet ray-ozone annealing process is performed; and, then, an oxygen annealing process is performed.

8. A method of manufacturing a semiconductor device in which a single-layered tantalum oxide film is formed as a capacitance insulation film on a semiconductor substrate by a chemical vapor deposition process with the use of a source gas containing pentaethoxy tantalum, comprising:
   a step for forming said single-layered tantalum oxide film at a temperature of over 500 and not more than 560° C. under a pressure of from 1 to 10 Torr.

9. The method of manufacturing the semiconductor device according to claim 8, wherein: said single-layered tantalum oxide film is formed with the use of said source gas free of molecular oxygen.

10. The method of manufacturing the semiconductor device according to claim 8, wherein: said single-layered tantalum oxide film is formed to cover a lower electrode of a microelectronic capacitor which is formed on said semiconductor substrate.

11. The method of manufacturing the semiconductor device according to claim 10, wherein: said single-layered tantalum oxide film is formed to cover a conductive film, said conductive film being formed on said lower electrode to have its surface area increased.

12. The method of manufacturing the semiconductor device according to claim 11, wherein: a silicon film is used as said conductive film.

13. The method of manufacturing the semiconductor device according to claim 12, wherein: formed between said silicon film and said single-layered tantalum oxide film is a reaction prevention film for preventing said silicon film from reacting with said single-layered tantalum oxide film.

14. The method of manufacturing the semiconductor device according to claim 13, wherein: a silicon nitride film is used as said reaction prevention film.

15. The method of manufacturing the semiconductor device according to claim 8, wherein: after completion of formation of said single tantalum oxide film, an ultraviolet ray-ozone annealing process is performed; and, then, an oxygen annealing process is performed.

* * * * *